United States Patent [19]

Purland

[11] 4,127,810

[45] Nov. 28, 1978

[54] DIGITAL VOLTMETER

[75] Inventor: Donald A. Purland, New Hope, Minn.

[73] Assignee: Ideal Industries, Inc., Sycamore, Ill.

[21] Appl. No.: 779,479

[22] Filed: Mar. 21, 1977

[51] Int. Cl.² ............... G01R 17/06; G01R 19/22; H03K 13/02

[52] U.S. Cl. .................. 324/99 D; 324/119; 340/347 AD

[58] Field of Search ............ 324/99 D, 99 R, 120, 324/115, 133, 119; 340/347 AD

[56] References Cited

U.S. PATENT DOCUMENTS

| | | | |
|---|---|---|---|
| 3,122,729 | 2/1964 | Bothwell et al. | 324/99 D |
| 3,303,493 | 2/1967 | Charbonnier | 340/347 AD |
| 3,611,131 | 10/1971 | Burkhart et al. | 324/115 |
| 3,742,354 | 6/1973 | Sugiyama | 324/115 |

*Primary Examiner*—Rudolph V. Rolinec
*Assistant Examiner*—Ernest F. Karlsen
*Attorney, Agent, or Firm*—Kinzer, Plyer, Dorn & McEachran

[57] ABSTRACT

An analog to digital converter for use in a digital voltmeter includes a periodic source of reference signal in ramp form starting at a negative potential and increasing to a given positive potential. The ramp signal and an analog signal to be measured form the inputs for a first comparator which provides a given output level as long as the ramp signal is less than the analog signal. A source of clock signals and the output of the first comparator are connected to a first logic circuit which provides an output of clock signals during the period that the first comparator is at the given level. A second comparator is connected to the ramp signal and ground potential and provides a given output level until the ramp signal reaches ground potential. A second logic circuit is connected to the output of the second comparator and the first logic circuit and provides clock signals during the period that the ramp signal is above ground potential and less than the analog signal. The output from the second logic circuit is connected to counting and display means for visually indicating the voltage being measured.

10 Claims, 4 Drawing Figures

DIGITAL VOLTMETER

SUMMARY OF THE INVENTION

The present invention relates to digital voltmeters and in particular to an improved simply operable method of analog to digital conversion.

A primary purpose of the invention is an analog to digital converter for the use described using a single ramp reference voltage and including circuitry for eliminating the negative portion of the ramp.

Another purpose is an analog to digital converter of the type described including means for indicating when the input signal is overrange.

Another purpose is an analog to digital converter for use in a digital voltmeter which only measures voltages of one polarity and includes means for indicating incorrect polarity.

Another purpose is a precision rectifier for use with an analog to digital converter of the type described.

Another purpose is a digital voltmeter capable of measuring on both AC and DC voltages.

Another purpose is a simply constructed reliably operable portable digital voltmeter including means for checking lead continuity.

Other purposes will appear in the ensuing specification, drawings and claims.

BRIEF DESCRIPTION OF THE DRAWINGS

The invention is illustrated diagrammatically in the following drawings wherein.

DESCRIPTION OF THE PREFERRED EMBODIMENT

The present invention relates particularly to a digital voltmeter of the portable type which is usable by electricians to check the presence, absence and level of voltages which they may be working upon. The circuitry is simplified, inexpensive to manufacture and reliably operable. There are a number of advantageous features in the voltmeter described; specifically, the circuitry includes an overrange indicator, an indicator displaying when incorrect polarity is being measured by the probes, a continuity checker for the voltmeter probes and an improved rectifier for accurately converting measured AC signals into RMS equivalent rectified DC for use in the voltmeter measuring circuit.

Figure 1:
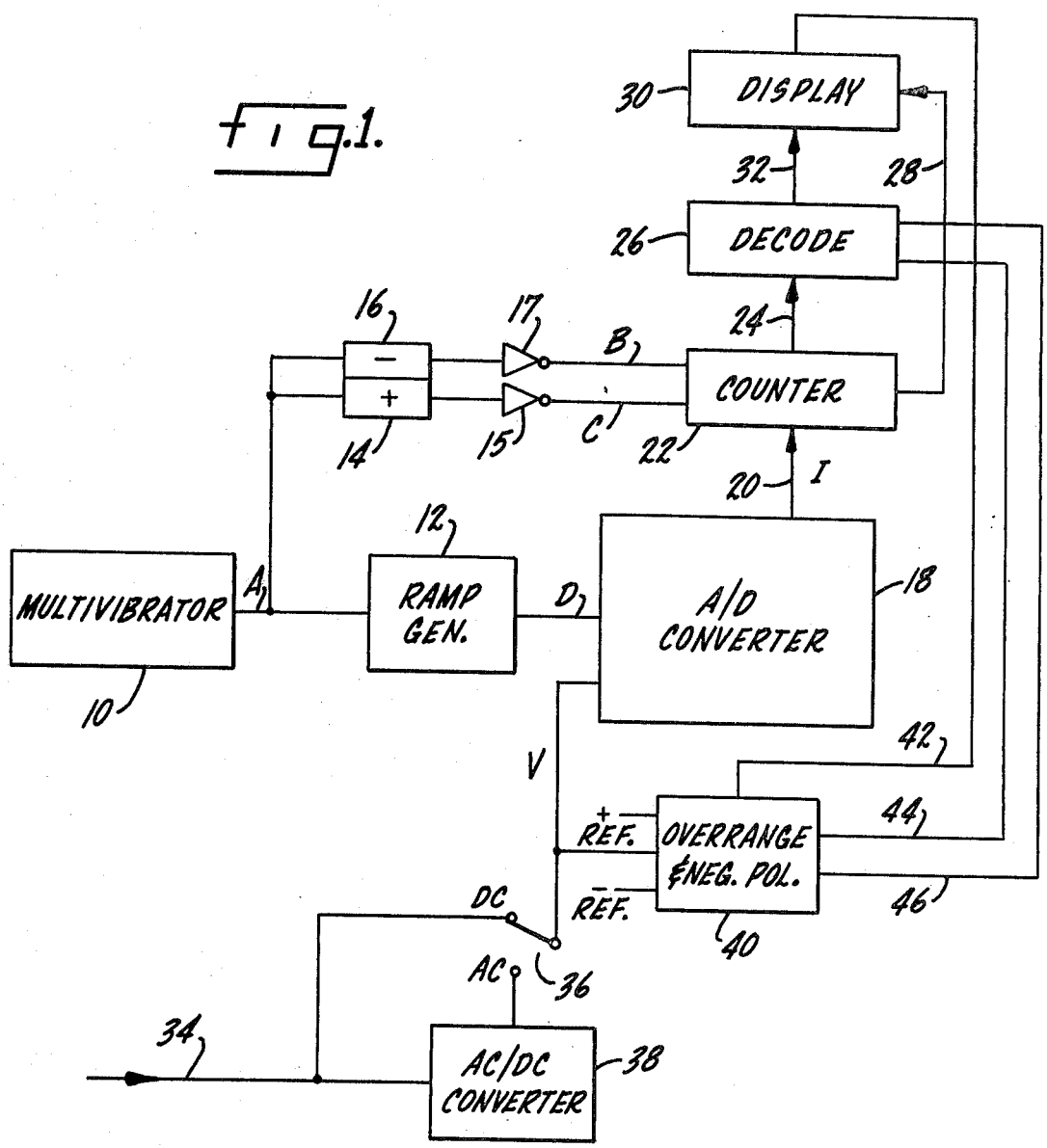
FIG. 1 is a schematic illustration of the digital voltmeter disclosed herein.
Figure 4:
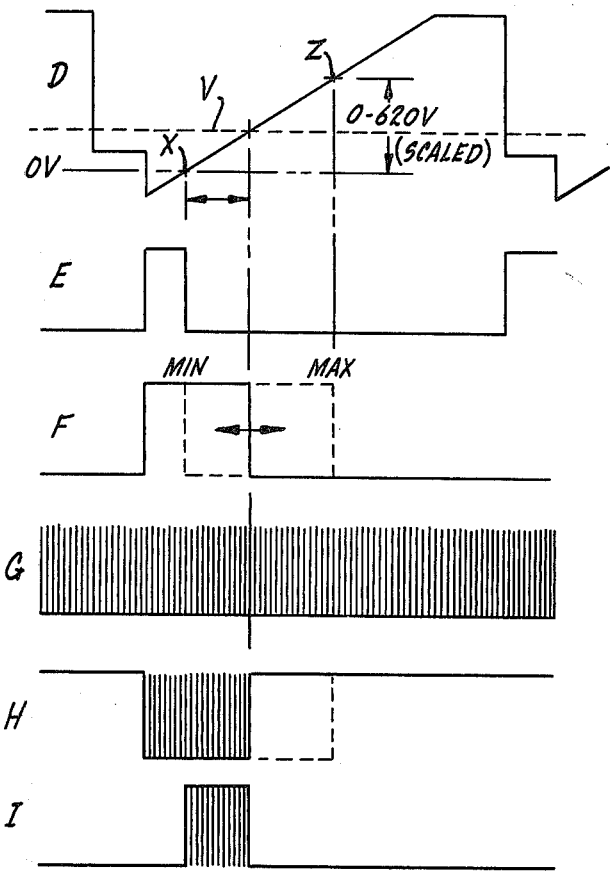
FIG. 4 is a waveform diagram illustrating the relationship between signals at various portions of the voltmeter.

In FIG. 1 a multivibrator is indicated at 10 and provides a series of spaced pulses, as indicated at waveform A in FIG. 4. Multivibrator 10 is connected to a ramp generator 12 which provides a sawtooth signal of the form shown at waveform D in FIG. 4. The ramp begins at the trailing edge of each pulse from multivibrator 10 and begins at a negative potential and rises to a positive potential. The ramp completely passes through its signal pattern between intervals of the pulses from multivibrator 10.

The output of multivibrator 10 is also connected to a plus differentiator 14 and a negative differentiator 16. The differentiators are connected through invertors 15 and 17 to counter 22. The inverted output from differentiator 16, indicated as a positive pulse in waveform B in FIG. 4, provides a reset signal for the counting and display means to be described herein. The reset pulse is located at the trailing edge of each multivibrator pulse. The inverted output from differentiator 14, the negative pulse of waveform C, provides the latching signal for the counting and display means and is coincident with the leading edge of the multivibrator output.

An analog to digital converter is indicated at 18 and is connected to ramp generator 12 and has its output along line 20 connected to a counting device 22. Counting device 22 is connected by a line 24 to a decoder 26 and by a line 28 to a display device 30. Display device 30 may also be connected by a line 32 to decoder 26. The display means may conveniently be an FND357, the decoder/driver for the display device may be an MC14511CP and the counter may be an MC14553CP.

The scaled input signal being measured is provided on line 34 which is connected through a switch 36 to A/D converter 18. An AC/DC converter 38 is connected to input 34 and to switch 36 and converts AC input signals to RMS equivalent DC signals usable in converter 18.

An overrange and negative polarity circuit 40 is connected to the voltage input of converter 18 and has outputs on lines 42, 44 and 46 connected to decoder 26 and display device 30 as will be explained more fully hereinafter.

In operation, the basic timing waveform is provided by multivibrator 10 and beginning at the trailing negative edge of each multivibrator output pulse, ramp generator 12 will provide the designated ramp voltage. Within the analog to digital converter 18, the ramp voltage is compared with the scaled input voltage being measured and, as described hereinafter, the output from converter 18 will be a series of clock pulses, the number of which directly relate to the amplitude of the voltage being measured. These pulses are provided along line 20 to counter 22. At the beginning of a counting period, the positive pulse of waveform B will reset the counter. The pulses are then counted and at the end of the counting period the pulses are transferred to latches within counter 22 by the negative pulse of waveform C. The latched count output on line 24 is the BCD number of pulses counted, and is converted by decoder 26 to seven segment pulses. The decoded pulses are subsequently displayed by a series of light emitting diodes in display device 30.

Figure 2:
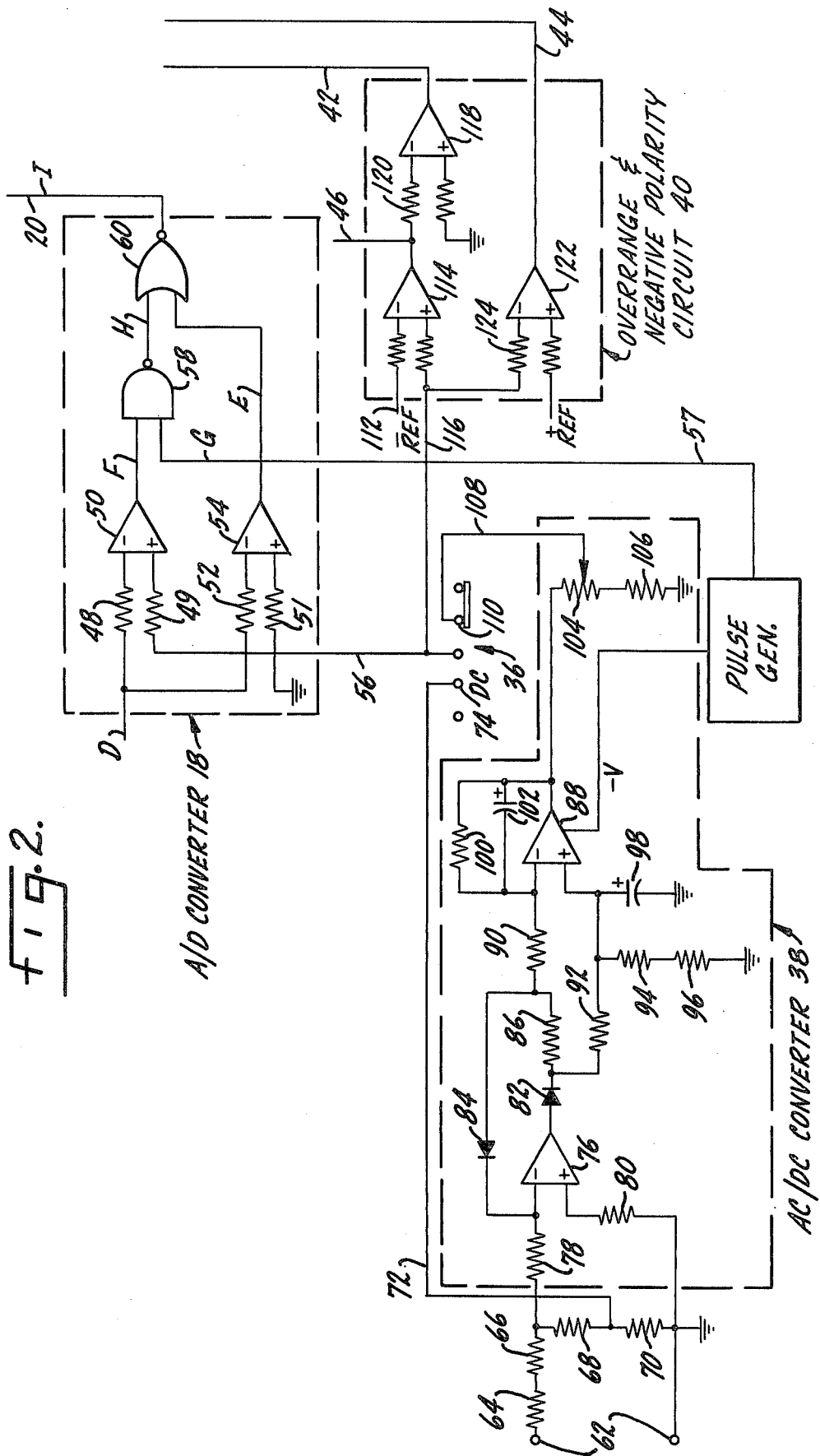
FIG. 2 is an electrical diagram of portions of the voltmeter.

Looking specifically at A/D converter 18, in FIG. 2, waveform D, the output from ramp generator 12, is connected through a resistor 48 to one terminal of an operational amplifier/comparator 50. Waveform D is also connected through a resistor 52 to one terminal of a second operational amplifier/comparator 54. The scaled input voltage being measured, along line 56, is connected through resistor 49 to the other terminal of operational amplifier/comparator 50. The other terminal of comparator 54 is connected through resistor 51 to ground. Comparator 50 will provide a given positive output level, waveform F, until ramp voltage is equal to the analog voltage being measured at which time the level will drop to zero, as indicated in FIG. 4. The output from comparator 54, waveform E, is a voltage level, initiated at the beginning of the ramp waveform and ending when the ramp voltage passes through zero potential. Thus, the duration of the pulse of waveform E is equal to the time period from initiation of the ramp voltage until the ramp voltage passes through zero or during the negative portion of the ramp voltage.

A source of clock pulses, for example 20 Khz, is provided along line 57, with the clock pulses being connected to a NAND gate 58 which also receives waveform F or the output of comparator 50. The output from NAND gate 58, waveform H, is the series of pulses that occur during the period of the pulse of waveform F. NAND gate 58 is connected to a NOR gate 60 which also receives an input from comparator 54, waveform E. The output from NOR gate 60, waveform I, is the series of pulses occurring during the period beginning when ramp voltage passes through zero potential and ending when the ramp voltage and the analog voltage being measured are equal. Pulses I, line 20, are passed to counter 22 in the manner described above.

Since it is not economically or realistically practical to provide a ramp voltage that starts at zero and is linear throughout its entire waveform, the ramp voltage must be started at a slightly negative potential. However, in order to have an accurate indication of the actual voltage being measured, the negative portion of the ramp must be eliminated or subtracted from the time period of the ramp. Thus, the logic circuitry including comparator 54 and NOR gate 60, subtract from the number of pulses provided by the total ramp period those pulses occurring before the ramp reaches zero potential. It is this final number of pulses which is provided to the counter as indicated. The number in the counter will be decoded and displayed as described previously.

As the voltmeter described will normally be used by an electrician to measure both AC and DC voltages, it is necessary to rectify an AC voltage so that it may be used in the A/D converter described. The input terminals for the voltmeter, indicated generally at 34 in FIG. 1, are designated specifically at 62 in FIG. 2. A voltage divider formed of resistors 64, 66, 68 and 70 is connected between the terminals with the tap between resistors 68 and 70 being connected along line 72 to the DC terminal 74 of switch 36. A first operational amplifier 76 is connected through a resistor 78 to the junction point between resistors 66 and 68. The other terminal of amplifier 76 is connected through a resistor 80 to ground. A diode 82 is connected to the output of amplifier 76 and a second diode 84 completes the halfway rectifier circuit and is connected between input and output terminals of amplifier 76 through a resistor 86. The output from the rectifier described is a series of halfwave negative going pulses.

A second operational amplifier 88 is connected through a resistor 90 to resistor 86 with its other input being provided through a filtering device formed from resistors 92, 94 and 96 and a capacitor 98. The described filter is a low pass filter and there is a second low pass filter connected in parallel with amplifier 88 and consists of a resistor 100 and a capacitor 102. The output from amplifier 88, which is a precisely accurate RMS equivalent smooth DC voltage, is connected to a pair of calibrating resistors 104 and 106 and then through a line 108 to the AC terminal 110 of switch 36.

A reference source of negative potential is supplied along line 112 to an operational amplifier 114. The analog voltage being measured, after being scaled by the voltage divider described above is supplied along line 116 to the other terminal of amplifier 114. Amplifier 114 functions as a comparator and as long as the voltage on line 116 is zero or a positive voltage it will have a high output. The output from comparator 114 is connected along line 46 to the blanking input of decoder 26. When the input voltage or the voltage on line 116 goes negative, the output of comparator 114 will go low, blanking the display.

The output of comparator 114 is also connected to an inverter 118, through a resistor 120. The other input for inverter 118 is ground, with the output being connected along line 42 to the decimal point indicator of display 30. Thus, when the output of comparator 114 goes low, the output of inverter 118 will go high, lighting the decimal point. Thus, in the event the voltage probes are used in an incorrect manner, polarity reversed, the indicator will go blank and the decimal point will show, advising the electrician or user of the instrument that he must reverse the probes.

The input voltage on line 116 is also connected to an operational amplifier 122 through a resistor 124. The other input for amplifier 122 is a positive reference voltage which is slightly above the normal maximum operating scaled voltage that would be measured by the instrument. The output from amplifier 122 is connected along line 44 to decoder 26.

The instrument is designed to be accurate to approximately 620 volts. Input voltages above that level can be measured, but accuracy is decreased. The display will only have the capability of indicating three digits. Thus, for a voltage above 1,000 volts, the display would actually show a low voltage, as there is no fourth digit. This could create a substantial hazard to an electrician, thinking that there is a low voltage when in fact the voltage is greater than 1,000 volts. Thus, amplifier 122 is used as an overrange indicator. Whenever the voltage being measured exceeds the reference voltage, the output of amplifier 122 goes low. As the output, line 44, is connected to the lamp test input of decoder 26, a low voltage at the output of amplifier 122 will cause all of the display digits to show an eight, or some other convenient digit above normal range. Thus, when the electrician sees such a display he immediately knows that the voltage being measured is overrange.

Figure 3:
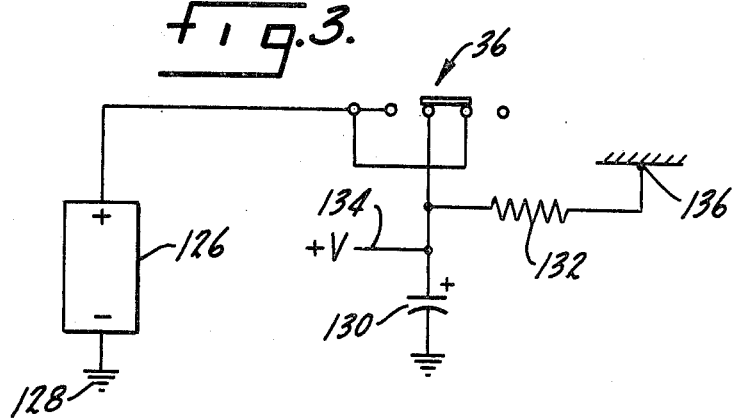
FIG. 3 is an electrical diagram illustrating the lead continuity test portion of the voltmeter.

In FIG. 3, a battery is indicated at 126 and has one side connected to ground, as at 128. The positive terminal of the battery is connected to switch 36, with one of the switch poles being connected through a capacitor 130 to ground. A small resistor, for example 1 K, indicated at 132, is connected to the battery plus voltage, indicated at 134, and a convenient location, for example the frame 136 of the switch. To test lead continuity, the positive probe is placed against the switch frame. The display should show battery voltage, assuming there is continuity through the positive probe. If the negative probe is then placed against the switch frame, the display should go to zero which would then indicate that both the positive and negative probes have continuity. Without a reliable means for checking lead continuity, an electrician could well consider there to be no voltage present when in fact there could be a substantial voltage.

The digital voltmeter described is a compact reliably constructed, relatively inexpensive unit which may be used by an electrician to determine the amplitude of either AC or DC voltages. The unit includes an overrange indication to insure that the reading from the three digit display is in fact accurate. There is a polarity reversal indication as the unit will only measure voltages of one polarity. A precision rectifier is used to convert AC signals to a DC voltage which may be utilized in the particular A/D converter shown. The converter itself utilizes a single ramp voltage which starts at a slightly negative value and increases to a given positive value. The ramp voltage passes through its complete cycle during the period between pulses from timing multivibrator 10. Clock pulses are gated during the entire period the ramp voltage is less than the voltage being measured, but those clock pulses occurring during the negative portion of the ramp are subtracted out by the described logic circuitry.

The particular A/D converter may have use in instruments other than a voltmeter. For example, the same or similar circuitry may be used in a resistance or capacitance meter.

Whereas the preferred form of the invention has been shown and described herein, it should be realized that there may be many modifications, substitutions and alterations thereto.

The embodiments of the invention in which an exclusive property or privilege is claimed are defined as follows:

1. Apparatus for providing a digital display of a measured analog signal including a periodic source of reference signal in ramp form starting at a negative potential and increasing to a given positive potential, an analog signal to be measured, a first comparator circuit connected to said ramp signal and analog signal and providing a given output level as long as the ramp signal is less than the analog signal, a source of clock signals, first logic means connected to said first comparator and clock source for providing clock signals during the period that said first comparator is at said given level, a second comparator circuit connected to said ramp signal and ground potential and providing a given output level until said ramp signal reaches ground potential, second logic means connected to said second comparator and first logic means for providing clock signals during the period that said ramp signal is above ground potential and less than said analog signal, counting and display means connected to said second logic circuit, input terminals, a rectifier connected to said input terminals, switch means connected to said input terminals, rectifier and first comparator circuit, said rectifier comprising a pair of operational amplifiers, a first diode connected between the output of one amplifier and an input of the other, and a second diode connected between the output and input of said one amplifier.

2. The apparatus of claim 1 further characterized by and including an oscillator for periodically initiating said ramp signal.

3. The apparatus of claim 2 further characterized in that said oscillator includes a multivibrator.

4. The apparatus of claim 2 further characterized in that said first and second comparators include operational amplifiers.

5. The apparatus of claim 2 further characterized by and including reset and latching means connected between said multivibrator and said counting and display means.

6. The apparatus of claim 1 further characterized by and including overrange indicating means connected to said analog signal and said display means.

7. The apparatus of claim 6 further characterized in that said overrange indicating means includes an operational amplifier having inputs of said analog signal and a reference signal.

8. The apparatus of claim 7 further characterized in that said reference signal has a value above the normal value of said analog signal.

9. The apparatus of claim 1 further characterized by and including polarity indicating means connected to said analog signal and said display means.

10. The apparatus of claim 9 further characterized in that said polarity indicating means includes an operational amplifier having inputs of said analog signal and a negative reference signal.

* * * * *